(12) United States Patent
Matsumura

(10) Patent No.: US 7,147,991 B2
(45) Date of Patent: *Dec. 12, 2006

(54) PROCESS OF PREPARING PLANOGRAPHIC PRINTING PLATE

(75) Inventor: Toshiyuki Matsumura, Fujino-machi (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/067,060

(22) Filed: Feb. 24, 2005

(65) Prior Publication Data

US 2005/0196700 A1    Sep. 8, 2005

(30) Foreign Application Priority Data

Mar. 4, 2004    (JP)    ............................. 2004-060228

(51) Int. Cl.
G03F 7/016    (2006.01)
G03F 7/20    (2006.01)
G03F 7/32    (2006.01)

(52) U.S. Cl. .................. 430/302; 430/175; 430/176; 430/281.1; 430/286.1; 430/309; 430/494

(58) Field of Classification Search ................ 430/170, 430/171, 176, 281.1, 286.1, 287.1, 288.1, 430/302, 309, 494; 403/175
See application file for complete search history.

(56) References Cited

U.S. PATENT DOCUMENTS

| | | | | |
|---|---|---|---|---|
| 4,987,056 A | * | 1/1991 | Imahashi et al. | ......... 430/281.1 |
| 5,112,743 A | * | 5/1992 | Kamiya et al. | ............. 430/175 |
| 5,308,735 A | * | 5/1994 | Kanda et al. | ................ 430/175 |
| 5,397,675 A | | 3/1995 | Arimatsu et al. | |
| 5,849,463 A | | 12/1998 | Tsuji et al. | |
| 6,140,025 A | * | 10/2000 | Imai et al. | ................... 430/325 |
| 6,794,120 B1 | * | 9/2004 | Suzuki | ........................ 430/322 |
| 6,890,702 B1 | * | 5/2005 | Matsumura | ............... 430/284.1 |
| 2003/0113667 A1 | * | 6/2003 | Matsumura | ................. 430/302 |
| 2005/0181301 A1 | * | 8/2005 | Matsumura | ............... 430/270.1 |
| 2005/0214685 A1 | * | 9/2005 | Takamuki et al. | ........... 430/300 |

FOREIGN PATENT DOCUMENTS

EP    0 581 311 A2    2/1994

(Continued)

OTHER PUBLICATIONS

Patent Abstracts of Japan, vol. 2003, No. 12, Dec. 5, 2003, of JP 2004 020623 A (Fuji Photo Film Co., Ltd) Jan. 22, 2004, "Method of Making Plate for Planographic Printing".

*Primary Examiner*—Barbara L. Gilliam
(74) *Attorney, Agent, or Firm*—Frishauf, Holtz, Goodman & Chick, P.C.

(57) ABSTRACT

Disclosed is a process of preparing a planographic printing plate from a light sensitive planographic printing plate material comprising a hydrophilic support and provided thereon, an image formation layer containing (a) an alkali soluble resin with an acid value of 5 to 200 having an acryloyl group or a methacryloyl group, the alkali soluble resin being obtained by reacting a vinyl copolymer having a monomer unit derived from acrylic acid or methacrylic acid with an epoxy compound having an acryloyl group or a methacryloyl group in the molecule, and (b) a diazo resin, the process comprising the steps of imagewise exposing the light sensitive planographic printing plate material to ultraviolet light using an exposure device comprising a digital mirror device (DMD), and removing an image formation layer at non-exposed portions with an aqueous alkali solution to form an image.

11 Claims, 1 Drawing Sheet

FOREIGN PATENT DOCUMENTS

| | | |
|---|---|---|
| EP | 0 671 659 A1 | 9/1995 |
| JP | 2003-223007 A * | 8/2003 |
| JP | 2003-345033 A * | 12/2003 |
| JP | 2004-020623 * | 1/2004 |

* cited by examiner

PROCESS OF PREPARING PLANOGRAPHIC PRINTING PLATE

FIELD OF THE INVENTION

The present invention relates to a process of preparing a planographic printing plate.

BACKGROUND OF THE INVENTION

Hitherto, an image formation method has been carried out in a conventional photographic plate making, which comprises bringing a light sensitive planographic printing plate material into contact with an original with an image, and exposing to light through the original. Recently, a computer to plate (hereinafter referred as to CTP) system has spread which comprises recording directly a digital image onto a light sensitive planographic printing plate material employing a laser. However, in order to carry out scanning exposure in a short time employing a laser, not only a laser with high output power but a light sensitive planographic printing plate material for CTP having sensitivity of 1,000 to 10,000 times the sensitivity of a conventional contact exposure type light sensitive planographic printing plate material are required. A planographic printing plate material for CTP with such a high sensitivity is expensive, and has problem in that sensitivity varies after long term storage.

A method is proposed in which digital signals are recorded on a light sensitive planographic printing plate material employing a digital mirror device (hereinafter referred to also as DMD) and an ultraviolet lamp as a light source. This method is advantageous in view of cost reduction, since it is possible to use a conventional contact exposure type light sensitive planographic printing plate material having sensitivity in ultraviolet regions. However, this method has problem that exposure time takes several times that in a conventional contact exposure. Thus, a light sensitive planographic printing plate material is required which has high sensitivity in the ultraviolet regions.

In Japanese Patent O.P.I. Publication No. 2004-29296 is disclosed a method of preparing a printing plate from a planographic printing plate material comprising a hydrophilic support and an image formation layer containing a polymerizable ethylenically unsaturated compound, a photopolymerization initiator, and a sensitizing dye having a specific structure, the method comprising the step of exposing the planographic printing plate material to ultraviolet rays corresponding to image data employing a DMD to polymerize the polymerizable ethylenically unsaturated compound. A printing plate prepared according to this method provides high printing durability, but has problem in printing durability. In Japanese Patent O.P.I. Publication No. 2004-20623 is disclosed a method of preparing a printing plate from a planographic printing plate material comprising a curable resin, the method comprising the step of exposing the planographic printing plate material to ultraviolet rays corresponding to image data employing a DMD, while heating, wherein curable resin at exposed portions are cured. This method provides a printing plate high printing durability, but has problem in that a heating system for heating the planographic printing plate material is complicate and impracticable, and the heating temperature is difficult to control, resulting in instability of image forming conditions. Further, a printing plate prepared according to this method has poor chemical resistance, and has problem in that when in a printing process ink stains at the non-image portions are removed employing a cleaning solution, so-called a plate cleaner, image portions, particularly small dots are likely to disappear.

SUMMARY OF THE INVENTION

An object of the invention is to provide a process of preparing, in a short time, a planographic printing plate with high chemical resistance and high printing durability from a planographic printing plate material, employing a digital mirror device (DMD) in a CTP system.

DETAILED DESCRIPTION OF THE INVENTION

Figure 1:
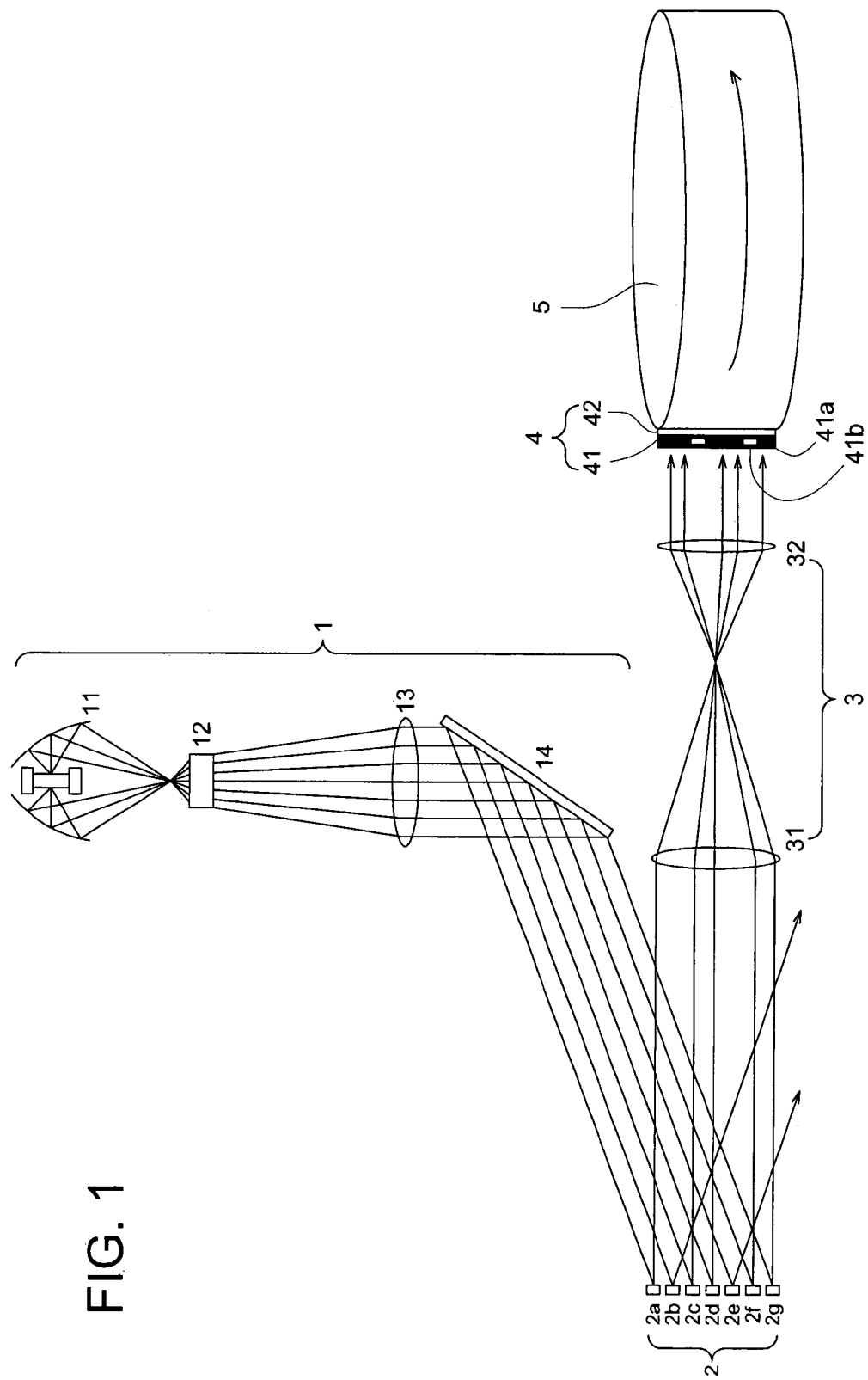
FIG. 1 shows a schematic view of a fundamental structure of an exposure device employing DMD.

The above object has been attained by one of the following constitutions:

1-1. A process of preparing a planographic printing plate from a light sensitive planographic printing plate material comprising a hydrophilic support and provided thereon, an image formation layer containing (a) an alkali soluble resin with an acid value of 5 to 200 having an acryloyl group or a methacryloyl group, the alkali soluble resin being obtained by reacting a vinyl copolymer having a monomer unit derived from acrylic acid or methacrylic acid with an epoxy compound having an acryloyl group or a methacryloyl group in the molecule, and (b) a diazo resin, the process comprising the steps of imagewise exposing the light sensitive planographic printing plate material to ultraviolet light using an exposure device comprising a digital mirror device (DMD), and removing an image formation layer at non-exposed portions with an aqueous alkali solution to form an image.

1-2. The process of item 1-1 above, wherein the weight average molecular weight of the alkali soluble resin is in the range of from 5,000 to 200,000.

1-3. The process of item 1-1 above, wherein the weight average molecular weight of the alkali soluble resin is in the range of from 10,000 to 100,000.

1-4. The process of item 1-1 above, wherein the image formation layer contains the alkali soluble resin in an amount of from 20 to 90% by weight, and the diazo resin in an amount of from 3 to 20% by weight.

1-5. The process of item 1-1 above, wherein the diazo resin is a condensation resin obtained by condensation of an aromatic diazonium compound and a carbonyl group-containing compound.

1-6. The process of item 1-5 above, wherein the diazo resin is a resin represented by the following formula (1) or (2):

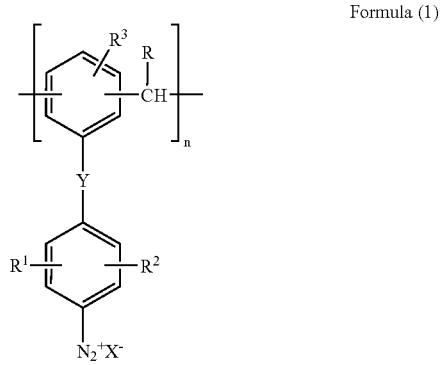

Formula (1)

wherein R represents a hydrogen atom, an alkyl group or a phenyl group; $R^1$, $R^2$ and $R^3$ independently represent a hydrogen atom, an alkyl group or an alkoxy group; X⁻ represents an anion; Y represents —NH—, —O— or —S—; and n represents an integer,

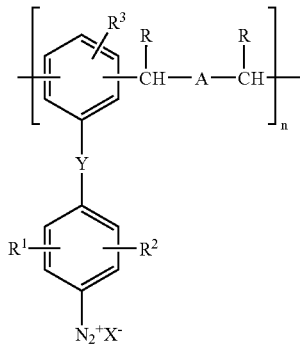
Formula (2)

wherein R represents a hydrogen atom, an alkyl group or a phenyl group; $R^1$, $R^2$ and $R^3$ independently represent a hydrogen atom, an alkyl group or an alkoxy group; X⁻ represents an anion; Y represents —NH—, —O— or —S—; n represents an integer, and A represents a divalent aromatic group.

1-7. The process of item 1-1 above, wherein the image formation layer further contains an ethylenically unsaturated compound.

1-8. The process of item 1-1 above, wherein the exposure device comprises, in addition to the DMD, a light source element, and an image formation element.

1-9. The process of item 1-1 above, wherein the DMD is comprised of a lot of micro-mirrors, which reflect ultraviolet light.

1-10. The process of item 1-1 above, wherein the ultraviolet light has a wavelength of 350 to 450 nm.

Next, the present invention will be explained in detail.

The alkali soluble resin binder (hereinafter also referred to as the binder in the invention), containing an acryloyl group or a methacryloyl group (hereinafter also referred to as (meth)acryloyl group), is obtained by reacting a vinyl copolymer having acrylic acid or methacrylic acid (hereinafter also referred to as (meth)acrylic acid) as a monomer unit with an epoxy compound having a (meth)acryloyl group in the molecule. The binder in the invention is synthesized by copolymerizing (meth)acrylic acid with another monomer to prepare a copolymer, and then reacting the resulting copolymer with an epoxy compound having a (meth)acryloyl group in the molecule, wherein the epoxy compound is added to the copolymer on ring-opening reaction.

As a monomer with which (meth)acrylic acid is copolymerized, there is an alkyl methacrylate or an alkyl acrylate. Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate.or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate or N,N-dimethylaminoethyl acrylate.

The binder in the invention can further contain, as another monomer unit, a monomer unit derived from the monomer described in the following items (1) through (14). However, the monomer is not limited thereto.

1) A monomer having an aromatic hydroxy group, for example, o-, (p- or m-) hydroxystyrene, or o-, (p- or m-) hydroxyphenylacrylate;

2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

3) A monomer having an aminosulfonyl group, for example, m- or p-aminosulfonylphenyl methacrylate, m- or p-aminosulfonylphenyl acrylate, N-(p-aminosulfonylphenyl)methacrylamide, or N-(p-aminosulfonylphenyl)acrylamide;

4) A monomer having a sulfonamido group, for example, N-(p-toluenesulfonyl)acrylamide, or N-(p-toluenesulfonyl) methacrylamide;

5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;.

7) A vinyl ether, for example, ethyl vinyl ether, 2-chloroethyl vinyl ether, propyl vinyl ether, butyl vinyl ether, octyl vinyl ether, or phenyl vinyl ether;

8) A vinyl ester, for example, vinyl acetate, vinyl chroloacetate, vinyl butyrate, or vinyl benzoate;

9) A styrene, for example, styrene, methylstyrene, or chloromethystyrene;

10) A vinyl ketone, for example, methyl vinyl ketone, ethyl vinyl ketone, propyl vinyl ketone, or phenyl vinyl ketone;

11) An olefin, for example, ethylene, propylene, isobutylene, butadiene, or isoprene;

12) N-vinylpyrrolidone, N-vinylcarbazole, or N-vinylpyridine,

13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

The copolymerization can be easily carried out in a solution containing a conventional thermal polymerization initiator and monomers. A general polymerization is described in "Radical polymerization Handbook —Fundamental and New development—", published by N.T.S Co.

The binder in the invention is obtained by reacting the carboxyl group contained in the above-obtained vinyl copolymer with an epoxy compound having a (meth)acryloyl group in the molecule, wherein the epoxy compound is added to the vinyl copolymer on ring-opening reaction. Examples of the epoxy compound having a (meth)acryloyl group include glycidyl methacrylate, glycidyl acrylate, and the following compound having an alicyclic epoxy group.

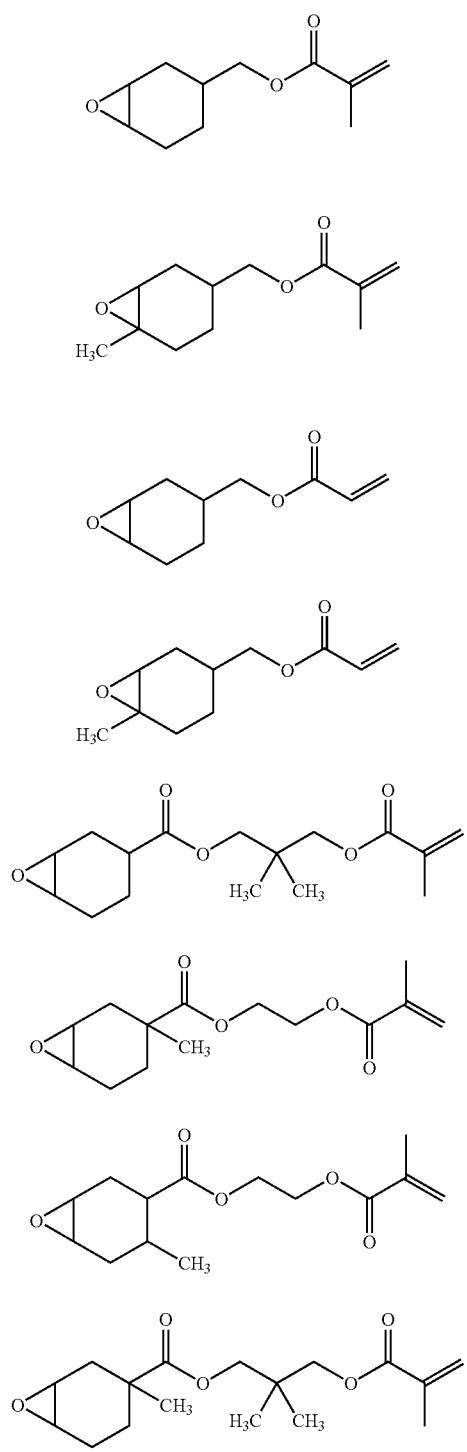

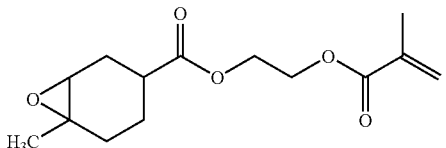

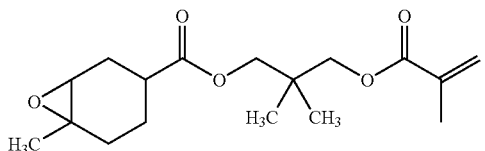

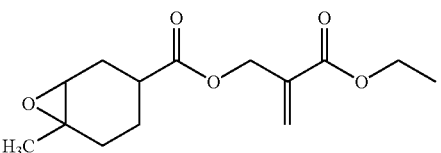

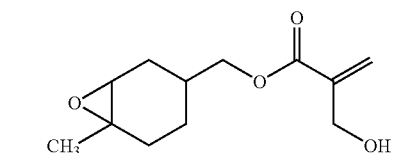

The weight average molecular weight of the alkali soluble resin in the invention is not specifically limited, but is in the range of from preferably 5,000 to 200,000, and more preferably from preferably 10,000 to 100,000. The addition amount of the epoxy compound having a methacryloyl group to the copolymer is in the range of preferably from 0.5 to 50 parts by weight, and more preferably from 1 to 40 parts by weight, based on 100 parts by weight of the copolymer. In order to add the epoxy compound to the copolymer, it is necessary that the copolymer have a carboxyl group in the molecule. This addition reaction is accelerated in the presence of a small amount of an amine derivative as a catalyst, whereby the copolymer is obtained in a short time with high yield.

The binder in the invention has preferably a carboxyl group remaining unreacted in the above addition reaction in view of alkali solubility. The amount of remaining carboxyl group in the binder is such that the acid value of the binder is in the range of preferably from 5 to 200, more preferably from 10 to 150, and most preferably 10 to 120. The content of the binder in the invention of the image formation layer is preferably from 20 to 90% by weight, and more preferably from 30 to 80% by weight.

The binder in the invention may be used in combination with other resins. Examples of the other resins include the copolymers described above before addition of the epoxy compound and resins described in paragraph [0056] of Japanese Patent O.P.I. Publication No. 2003-345011.

The diazo resin in the invention is, for example, a diazo resin, which is a condensation product of an aromatic diazonium salt with formaldehyde or acetaldehyde. Examples of the diazo resin include a hexafluorophosphate, a tetrafluoroborate, perchlorate or periodate salt of a condensation product of p-diazophenylamine with formaldehyde or acetaldehyde, an inorganic salt of the condensation product, and a sulfonate salt of the condensation product disclosed in U.S. Pat. No. 3,300,309.

The preferred diazo resin is a co-condensation product of diazodiphenylamine with an aromatic compound having a carbonyl group or a sulfonyl group in the molecule. A co-condensation ratio by mole of diazodiphenylamine to the aromatic compound is preferably from 30:70 to 95:5. The especially preferred is a co-condensation product of diazodiphenylamine with p-hydroxybenzoic acid having a diazodiphenylamine to p-hydroxybenzoic acid ratio by mole of from 50:50 to 80:20.

In the invention, the diazo resin is preferably a condensation resin obtained by condensation of an aromatic diazonium compound and a carbonyl compound. The condensation resin has preferably a diazo resin having the structure represented by the following formula (1) or (2):

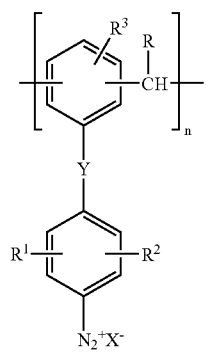

Formula (1)

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; and n represents an integer.

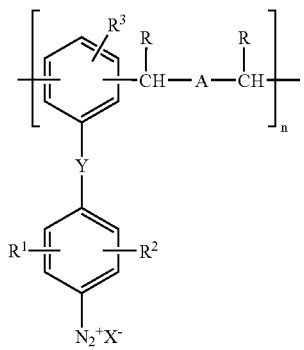

Formula (2)

wherein A represents a divalent aromatic group; R, $R^1$, $R^2$, $R^3$, $X^-$, Y and n independently represent the same as denoted above.

The aromatic diazonium compound units contained in the above diazo resin represented by formula (1) or (2) include the diazonium salts as disclosed in Japanese Patent Publication No. 49-48001, and is preferably diphenylamine-4-diazonium salts. The diphenylamine-4-diazonium salts are derived from 4-amino-diphenylamines. The 4-amino-diphenylamines include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyldiphenylamine, 4-amino-3-ethoxydiphenylamine, 4-amino-3-β-hydroxyethoxy)diphenylamine, 4-aminodiphenylamine-2-sulfonic acid, 4-aminodiphenylamine-2-carboxilic acid and 4-aminodiphenylamine-2'-carboxilic acid. The preferable are 4-aminodiphenylamine and 4-amino-3-methoxydiphenylamine.

Examples of the aromatic compound used to provide the aromatic group A in formula (2) include m-chlorobenzoic acid, diphenylacetic acid, phenoxyacetic acid, p-methoxyphenylacetic acid, p-methoxybenzoic acid, 2,4-dimethoxybenzoic acid, p-phenoxybenzoic acid, 4-anilinobenzoic acid, 4-(m-methoxyanilino)benzoic acid, 4-(p-methylbenzoyl) benzoic acid, 4-(p-methylanilino)benzoic acid, phenol, xylenol, resorcin, 2-methylresorcin, methoxyphenol, ethoxyphenol, catechol, phloroglucin, p-hydroxyethylphenol, naphthol, pyrrogallol, hydroquinone, p-hydroxybenzyl alcohol, 4-chlororesorcin, biphenyl-4,4'-diol, 1,2,4-benzene triol, bisphenol A, 2,4-dihydroxy benzophenone, 2,3,4-trihydroxy benzophenone, p-hydroxyacetophenone, 4,4'-dihydroxydiphenyl ether, 4,4'-dimethoxydiphenyl ether, 4,4'-dihydroxydiphenyl amine, 4,4'-dihydroxydiphenyl sulfide, cumylphenol, chlorophenol, bromophenol, salicylic acid, p-hydroxybenzoic acid, 2-methyl-4-hydroxybenzoic acid, 2,4-dihydroxybenzoic acid, 2,6-dihydroxybenzoic acid, 3,5-dihydroxybenzoic acid, 4-chloro-2,6-dihydroxybenzoic acid, 4-methoxy-2,6-dihydroxybenzoic acid, gallic acid, phloroglucinol carboxylic acid, N-(4-hydroxyphenyl)methacryl amide, N-(4-hydroxyphenyl)acryl amide, cinnamic acid, methyl cinnamate, ethyl cinnamate, p-hydroxy cinnamic acid, styrene, hydroxy styrene, stilbene, 4-hydroxy stilbene, 4,4'-dihydroxy stilbene, 4-carboxy stilbene, 4,4'-dicarboxy stilbene, diphenyl ether, diphenyl ether, diphenyl thioether, 4-methoxydiphenyl ether, 4-methoxydiphenyl amine, and 4-methoxydiphenyl thioether.

Of these diazo resins preferred is a diazo resin having a carboxyl group in the molecule. The diazo resin having a carboxyl group in the molecule is preferably a diazo resin of formula (2), in which the aromatic group represented by A has a carboxyl group. Preferred examples of the aromatic compound used to provide the aromatic group represented by A having a carboxyl group in formula (2) include preferably p-hydroxybenzoic acid, p-methoxybenzoic acid, p-hydroxycinnamic acid, and phenoxyacetic acid.

The diazo resin above is obtained by condensating an aromatic diazonium salt and optionally, an aromatic compound providing the aromatic group represented by A in formula (2), with an active carbonyl compound such as formaldehyde, paraformaldehyde, acetoaldehyde, benzaldehyde, acetone or acetophenone in a sulfuric acid, phosphoric acid or hydrochloric acid solution, according to a conventional method as disclosed in Photo. Sci. Eng., Vol. 17, 33 (1973), U.S. Pat. Nos. 2,063,631 and 2,679,498, and Japanese Patent Publication No. 49-48001.

In formula (2), an aromatic compound used to provide the aromatic group represented by A, an aromatic diazo compound and an active carbonyl compound may be any combination, and condensation reaction can be carried out employing two or more kinds of each of them. In condensation reaction, the amount used of the aromatic compound used to provide the aromatic group represented by A is preferably 0.1 to 10 times by mol, more preferably 0.2 to 2 times by mol, and most preferably 0.2 to 1 time by mol the amount of the aromatic diazonium compound. The amount of the active carbonyl compound is preferably 0.5 to 1.5 times by mol, and more preferably 0.6 to 1.2 times by mol the total amount of the aromatic compound and the aromatic diazonium compound. The above mixture of the active carbonyl compound, the aromatic compound and the aromatic diazonium compound is reacted at lower temperature for short time, for example, about 3 hours, to obtain the diazo resin in the invention.

In the invention, the diazo resin functions as a photopolymerization initiator. Other photopolymerization initiators can be used together with the diazo resin.

Examples of the other photopolymerization initiators include radical generating compounds disclosed in Japanese Patent Publication No. 2002-537419, polymerization initiators disclosed in Japanese Patent O.P.I. Publication Nos. 2001-175006, 2002-278057, and 2003-5363, onium salts having two or more cation portions in the molecule disclosed in Japanese Patent O.P.I. Publication No. 2003-76010, N-nitroso amine compounds disclosed in Japanese Patent O.P.I. Publication No. 2001-133966, thermally radical generating compounds disclosed in Japanese Patent O.P.I. Publication No. 2001-343742, compounds of generating a radical or an acid by heat disclosed in Japanese Patent O.P.I. Publication No. 2002-6482, borate compounds disclosed in Japanese Patent O.P.I. Publication No. 2002-116539, compounds of generating a radical or an acid by heat disclosed in Japanese Patent O.P.I. Publication No. 2002-148790, photopolymerization initiators or thermal polymerization initiators each having a polymerizable unsaturated group disclosed in Japanese Patent O.P.I. Publication No. 2002-207293, onium salts having, as a counter ion, a divalent or more valent anion disclosed in Japanese Patent O.P.I. Publication No. 2002-268217, sulfonylsulfone compounds having a specific structure disclosed in Japanese Patent O.P.I. Publication No. 2002-328465, and thermally radical generating compounds disclosed in Japanese Patent O.P.I. Publication No. 2002-341519.

Preferred examples of the other photopolymerization initiators include a triarylsulfonium salt, an iodonium salt, a titanocene compound, an iron-arene compound, a trihalomethyltriazine compound, a bisimidazole compound, an acylphosphine oxide compound, a benzoin derivative, or an N-phenylglycine derivative. As the other photopolymerization initiators, a polyhaloacetyl compound such as a compound having a tribromoacetyl group, a dibromoacetyl group, trichloroacetyl group or a dichloroacetyl group is also preferred.

Exemplified compounds of the polyhaloacetyl compound will be listed below.

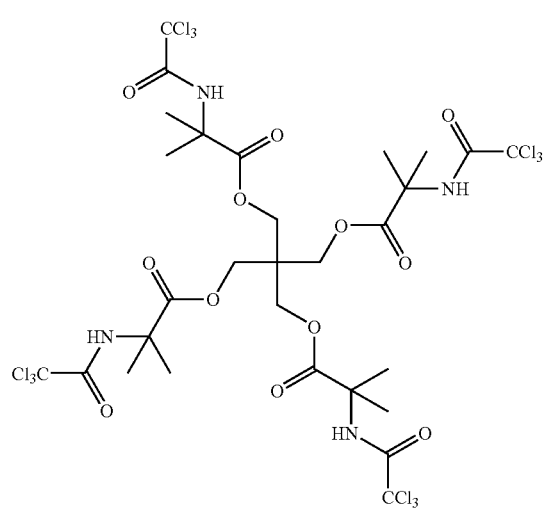

PHA01

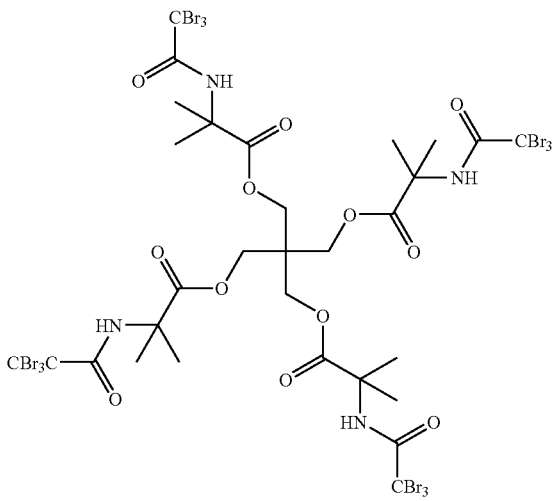

PHA02

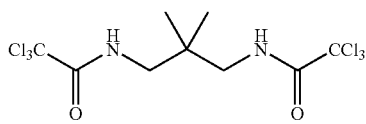

PHA03

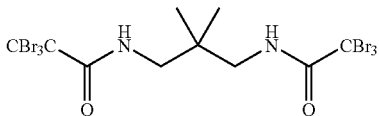

PHA04

The content of the diazo resin in the image formation is ordinarily from 3 to 20% by weight, and preferably from 5 to 15% by weight. The content of the other photopolymerization initiator in the image formation layer is not specifically limited, but is preferably from 0.1 to 20% by weight, and more preferably from 0.8 to 15% by weight.

In the invention, the image formation layer can contain an ethylenically unsaturated compound, so-called a monomer or a polyfunctional oligomer. The content of the monomer or polyfunctional oligomer in the image formation layer is preferably not more than 70% by weight, and more preferably from 20 to 60% by weight.

As the monomer or polyfunctional oligomer, there are a conventional radical polymerizable monomer, and a polyfunctional monomer or oligomer having two or more of an ethylenic double bond in the molecule as generally used in an ultraviolet curable resin composition.

The monomer or polyfunctional oligomer is not specifically limited. Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Prepolymers can be used, and the prepolymers can be used singly, in combination, or as an admixture thereof with the above described monomer and/or oligomer.

Examples of the prepolymer include polyester (meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethane-acrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane-diisocyanate.2-hydroxyethylacrylate; an alkyd modified acrylate obtained by incorporating a methacroyl group in an oil modified alkyd resin; and a spirane resin acrylate.

The image formation layer in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer used in the invention is a phosphate compound having at least one (meth)acryloyl group. The phosphate compound is a compound having a (meth)acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, an addition polymerizable ethylenically unsaturated monomer having a tertiary amino group in the molecule is preferably used as the polymerizable ethylenically unsaturated compound. Its molecular structure is not limited, but those are preferred in which a tertiary amine having a hydroxyl group is modified with glycidyl methacrylate, methacrylic chloride, or acrylic chloride. Examples thereof include a polymerizable compound disclosed in Japanese Patent O.P.I. Publication Nos. 1-165613, 1-203413 and 1-197213.

A reaction product of (i) a polyhydric alcohol having a tertiary amino group in the molecule, (ii) a diisocyanate, and (iii) a compound having both hydroxyl group and addition polymerizable ethylenically double bond in the molecule is preferably used in the invention.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto.

Examples of the compound having a hydroxyl group and an addition polymerizable ethylenically double bond in the molecule include compounds MH-1 through MH-13 as described later.

The chemical structure of MH-1 through MH-13 will be shown below.

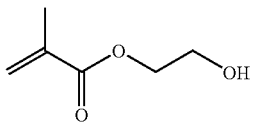

MH-1

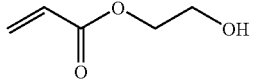

MH-2

-continued

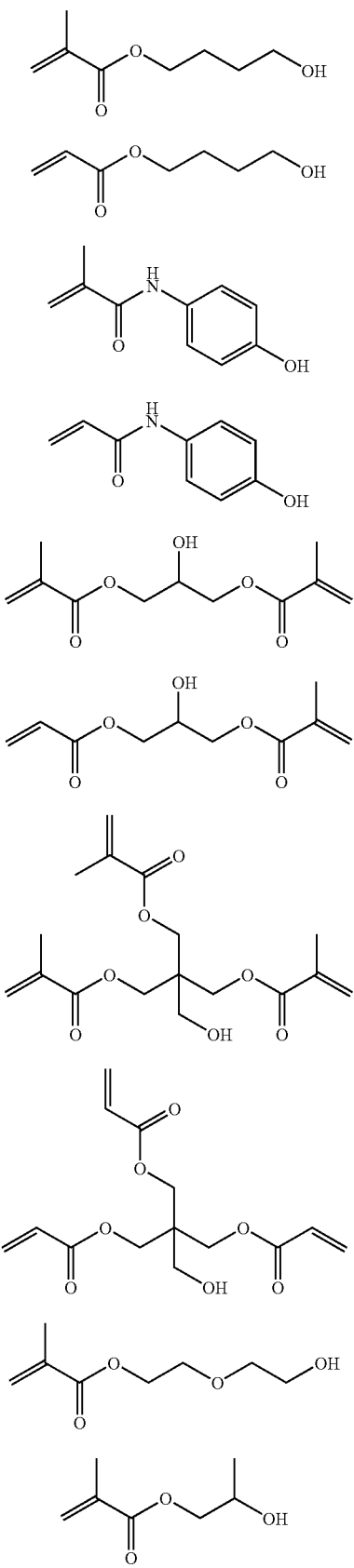

MH-3
MH-4
MH-5
MH-6
MH-7
MH-8
MH-9
MH-10
MH-11
MH-12

-continued

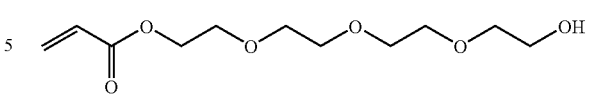

MH-13

Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

M-6: A reaction product of triethanolamine (1 mole), 1,3-bis (1-cyanato-1-methylethyl)benzene (3 moles), and 2-hydroxyethyl methacrylate (3 moles)

M-7: A reaction product of ethylenediamine tetraethanol (1 mole), 1,3-bis (1-cyanato-1-methylethyl)benzene (4 moles), and 2-hydroxyethyl methacrylate (4 moles)

In addition to the above, acrylates or methacrylates disclosed in Japanese Patent O.P.I. Publication Nos. 1-105238 and 2-127404 can be used.

The image formation layer in the invention is preferably added with a polymerization inhibitor, in order to prevent undesired polymerization of the ethylenically unsaturated monomer during the manufacture or after storage of light sensitive planographic printing plate material. Examples of the polymerization inhibitor include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the light sensitive layer. Further, in order to prevent undesired polymerization induced by oxygen, behenic acid or a higher fatty acid derivative such as behenic amide may be added to the layer. After the light sensitive layer is coated layer, the coated layer may be dried so that the higher fatty acid derivative is localized at the vicinity of the surface of the light sensitive layer. The content of the higher fatty acid derivative is preferably 0.5 to 10% by weight, based on the total solid content of the light sensitive layer.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment). Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

A surfactant may be added to the image formation layer in order to improve coatability of the layer. A preferred surfactant is a fluorine-contained surfactant.

Further, in order to improve physical properties of the cured light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The solvents used in the preparation of the coating liquid for the image formation layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

In the invention, a protective layer is preferably provided on the image formation layer. It is preferred that the protective layer (oxygen shielding layer) is highly soluble in the developer as described above (generally an alkaline solution). Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the photopolymerizable light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the planographic printing plate material in the invention, adhesive strength between the protective layer and the image formation layer is preferably not less than 35 mN/mm, more preferably not less than 50 mN/mm, and still more preferably not less than 75 mN/mm. Preferred composition of the protective layer is disclosed in Japanese Patent O.P.I. Publication No. 10-10742. The adhesive strength in the invention can be measured according to the following procedure.

When an adhesive tape with sufficient adhesive strength having a predetermined width is adhered onto the protective layer, and then peeled at an angle of 90° to the plane of the planographic printing plate material, strength necessary to peel the protective layer from the image formation layer is measured as the adhesive strength.

The protective layer may further contain a surfactant or a matting agent. The protective layer is formed, coating on the photopolymerizable light sensitive layer a coating solution in which the above protective layer composition is dissolved in an appropriate coating solvent, and drying. The main solvent of the coating solution is preferably water or an alcohol solvent such as methanol, ethanol, or isopropanol.

The thickness of the protective layer is preferably 0.1 to 5.0 µm, and more preferably 0.5 to 3.0 µm.

The supports in the invention include a plate having a hydrophilic surface of a metal such as aluminum, stainless steel, chromium, or nickel, a plastic film such as a polyester film, a polyethylene film or a polypropylene film which is deposited or laminated with the above-described metal, and a polyester film, a polyvinyl chloride film or a nylon film whose surface is subjected to hydrophilization treatment. Among the above, the aluminum plate is preferably used, and may be a pure aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 µm are dispersed in water to the surface of the support. The honing roughening method is carried out by ejecting obliquely slurry with pressure applied from nozzles to the surface of the support, the slurry containing volcanic ash particles with a particle size of 10 to 100 µm dispersed in water. A surface roughening can be also carried out by laminating a support surface with a sheet on the surface of which abrading particles with a particle size of from 10 to 100 µm was coated at intervals of 100 to 200 μm and at a density of $2.5 \times 10^3$ to $10 \times 10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight.

After the support has been electrolytically surface roughened, it is preferably dipped-in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 $A/dm^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 $mg/dm^2$, and preferably 10 to 40 $mg/dm^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

The prepared coating liquid for the image formation layer is coated on the support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

In the invention, the imagewise exposed image formation layer, which are cured are at exposed portions, is developed with an alkali developer, whereby the image formation layer at exposed portions are removed to form an image.

As the alkali developer, a conventional alkali aqueous solution is used. For example, there is an alkali developer containing an inorganic alkali agent such as sodium silicate, potassium silicate, ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, an d pyridine.

These alkali agents can be used singly or as a mixture of two or more thereof. The alkali developer can contain an anionic surfactant, an amphoteric surfactant, or an organic solvent such as alcohol.

The DMD in the invention is a reflection element in which a lot of micro-mirrors are arranged. The arrangement and the number of the micro-mirrors correspond to those of pixels in image data. The direction of each micro-mirror can be varied corresponding to each of image information in image data. When parallel rays are irradiated onto the reflection element, the reflection element reflects the rays according to image information so as to focus onto an imaging material, whereby an image is formed on the imaging material. Generally, an exposure device employing DMD comprises, in addition to the reflection element, a light source element (having a light source, a condenser, a lens and a mirror) producing parallel rays and an image formation element (having a lens and a mirror) for focusing the reflected rays onto an imaging material.

In the invention, a light source is used which is capable of emitting an ultraviolet light, and preferably a 350–450 nm ultraviolet light. Examples of the light source include high pressure mercury lamp, ultra-high pressure mercury lamp, a halogen lamp, and a metal halide lamp.

An ultraviolet light corresponding to digital image formation can be irradiated onto an imaging material employing a DMD. There is disclosure of an exposure device and exposure method for a printing plate material employing a DMD in WO 97/21151, 97/39277, 98/47048, 00/212735, and 00/36470, and U.S. Pat. No. 5,579,240.

FIG. 1 shows a schematic view of a fundamental structure of an exposure device comprising a DVD.

The exposure device in FIG. 1 comprises a light source element 1 producing parallel rays, an reflection element 2, in which a lot of micro-mirrors are arranged, and an image formation element 3 for focusing reflected rays onto a planographic printing plate material 4. The planographic printing plate material 4 is mounted on a drum 5.

The light source element 1 is comprised of a lamp 11, a condenser 12, a lens 13, and a mirror 14. The lamp 11 emits ultraviolet rays. The lamp 11 of FIG. 1 is a schematic view of a super high pressure mercury lamp. Ultraviolet rays emitted from the lamp 11 are varied to parallel rays by the condenser 12 and the lens 13. The resulting parallel rays are led to the reflection element 2 by the mirror 14.

In the reflection element 2, corresponding to a DMD, a lot of micro-mirrors 2a, 2b, 2c, 2d, 2e, 2f, and 2g are arranged. The number and arrangement of the micro-mirrors correspond to those of pixels in image data. The distance between any two micro-mirrors adjacent to each other is preferably from 1 to 100 μm. The direction of each micro-mirror can be varied corresponding to each of image information in image data. A DMD available on the market is constructed so that direction of the micro-mirrors varies by an angle of ordinarily 10 degrees.

In FIG. 1, five micro-mirrors 2a, 2c, 2d, 2f, and 2g correspond to a pixel of image portions while the other two micro-mirrors 2b and 2e correspond to a pixel of non-image portions. The micro-mirrors 2a, 2c, 2d, 2f, and 2g, corresponding to a pixel of image portions, are arranged so as to reflect parallel rays from the light source element 1 and focus the reflected rays onto an image formation element 3. On the, other hand, the micro-mirrors 2b and 2e, corresponding to a pixel of non-image portions, are arranged so as to reflect parallel rays from the light source element 1 to portions other than the image formation element 3.

As is described above, before exposure is carried out, direction of each mirror varies corresponding to each of pixel information in the image data.

Image formation element 3 in FIG. 1 is comprised of two lenses 31 and 32. The two lenses 31 and 32 refract reflected rays from the reflection element 2 to focus the refracted rays onto the surface of a planographic printing plate material 4.

It is preferred that pixel images are formed on the surface of the planographic printing plate material 4 at an interval of from 0.5 to 50 μm. The planographic printing plate material 4 comprises a hydrophilic support 42 and an image formation layer 41. In a photocurable image formation layer, the image formation layer at exposed portions 41a is cured. In a photo-solubilization image formation layer, the image formation layer at exposed portions 41a is soluble. In a photopolymer type image formation layer, the image formation layer at exposed portions 41a is photo-polymerized. In any image formation layer described above, no substantial change occurs at the image formation layer at unexposed portions 41b.

EXAMPLES

Next, the present invention will be explained in the following examples, but the present invention is not limited thereto. In the examples, "parts" represents "parts by weight", unless otherwise specified.

(Synthesis of Binder 1)

Thirty parts of methacrylic acid, 50 parts of methyl methacrylate, 20 parts of ethyl methacrylate, 500 parts of isopropyl alcohol, and 3 parts of α,α'-azobisisobutyronitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. The resulting reaction mixture was added with propylene glycol monomethyl ether to give a solution having a solid content of 20% by weight. Thus, a binder 1 solution was obtained.

The weight average molecular weight of the binder 1 was 35,000, measured according to GPC. The glass transition temperature Tg of the binder 1 was 85° C., measured according to DSC (differential thermal analysis). The acid value of the binder 1 was 70.

<<Preparation of Support 1>>

A 0.3 mm thick aluminum plate (material 1050, refining H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 1.0 weight % hydrochloric acid solution, desmut at 60° C. for 10 seconds in a 5% sodium hydroxide solution. The desmut aluminum plate was anodized at 25° C. for 1 minute at a current density of 10 A/dm$^2$ and at a voltage of 15 V in a 15% sulfuric acid solution, and further subjected to hydrophilization treatment at 75° C. in an aqueous 1% polyvinyl phosphonic acid solution. Thus, support 1 was obtained. The center line average surface roughness (Ra) of the support was 0.65 μm.

(Preparation of Light Sensitive Planographic Printing Plate Material Sample 1)

The following image formation layer coating solution 1 was coated on the support 1 through a wire bar, and dried at 95° C. for 1.5 minutes to give an image formation layer having a dry thickness of 2.0 g/m². Thus, light sensitive planographic printing plate material sample 1 was prepared.

| (Image formation layer coating solution 1) | |
|---|---|
| Diazo resin-1 (Condensation product of 4-diazonium-3-methoxydiphenylamine hexafluorophosphate with formaldehyde) | 10.0 parts |
| Binder 1 solution | 84.0 parts (in terms of solid content) |
| Aqueous 40% polyacrylic acid solution (Julimer AC-10L, produced by Nippon Junyaku Co., Ltd.) | 5.0 parts |
| 30% phthalocyanine pigment dispersion (MHI 454 produced by Mikuni Sikisosha) | 10.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |

(Evaluation of Planographic Printing Plate Material Sample 1)

<<Sensitivity>>

(Measurement of Sensitivity)

The planographic printing plate material sample 1 obtained above was imagewise exposed at a resolving degree of 2400 dpi, employing a DVD exposure device (UV setter 710S/HS, produced by basisprint Co., Ltd., and available from Toyo Ink Manufacturing Co., Ltd.) equipped with a 350–450 nm ultraviolet light source. The image pattern used for the exposure comprised a solid image and a square dot image with a screen number of 175 LPI (LPI means a line number per 2.54 cm) and a 50% dot area. Subsequently, the exposed sample was subjected to development treatment employing a CTP automatic developing machine (Raptor Thermal produced by Glunz & Jensen Co., Ltd.) to obtain a planographic printing plate. Herein, the developing machine comprised a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample.

The lowest exposure energy amount (μJ/cm²) reproducing the solid image without reduction of the layer thickness in the resulting planographic printing plate was defined as recording energy and evaluated as a measure of sensitivity. The less the recording energy is, the higher the sensitivity. The results are shown in Table 1.

| <Composition of developer (aqueous solution containing the following components)> | |
|---|---|
| Potassium silicate A aqueous solution (containing 25.5–27.5% by weight of SiO₂ and 12.5–14.5% by weight of K₂O) | 8.0% by weight |
| Newcol B-13SN (produced by Nippon Nyukazai Co., Ltd.) | 3.0% by weight |
| Potassium hydroxide | amount giving pH 12.3 |

<<Printing Durability>>

The printing plate material sample obtained above was exposed at an exposure amount of 200 μJ/cm², employing an image with a screen line number of 175, and developed with the developer, whereby a printing plate was obtained. Employing the resulting printing plate, printing was carried out on a press (DAIYA1F-1 produced by Mitsubishi Jukogyo Co., Ltd.), wherein a coat paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. The number of prints printed time when printing started until time when dot reduction at highlight portions was defined as a measure of printing durability. The results are shown in Table 1.

<<Chemical Resistance>>

The printing plate material sample obtained above was exposed at an exposure amount of 200 μJ/cm², employing an image with a screen line number of 175, and developed with the developer, whereby a printing plate was obtained. Employing the resulting printing plate, printing was carried out employing a press GTO (produced by Heiderberg Co., Ltd.), wherein a coat paper sheet, printing ink (Soybean oil ink, "Naturalith 100" produced by Dainippon Ink Kagaku Co., Ltd.), and dampening water (an H liquid, SG-51 produced by Tokyo Ink Co., Ltd., Concentration: 1.5%) were used. A cycle was repeated in which printing was stopped, when 500 sheets were printed, and the printing plate surface was wiped with a sponge impregnated with an ultra plate cleaner (available from Dainichi Seika Co., Ltd.), and allowed to stand for 3 minutes, and printing was restarted. The minimum number of cycles in which reduction of dots at highlight portions was observed was evaluated as a measure of chemical resistance. The results are shown in Table 1.

Example 2

<<Preparation of Support 2>>

Support 2 was prepared in the same manner as in support 2 of Example 1, except that hydrophilization treatment was carried out, employing an aqueous 1.5% sodium silicate A solution instead of an aqueous 1% polyvinyl phosphonic acid solution.

(Preparation of Light Sensitive Planographic Printing Plate Material Sample 2)

The following image formation layer coating solution 2 was coated-on the support 2 through a wire bar, and dried at 95° C. for 1.5 minutes to give an image formation layer having a dry thickness of 2.0 g/m². Thus, light sensitive planographic printing plate material sample 2 was prepared.

| (Image formation layer coating solution 2) | |
| --- | --- |
| Diazo resin-1 | 10.0 parts |
| Binder 1 solution | 45.0 parts (in terms of solid content) |
| Polyfunctional oligomer M-8 | 30.0 parts |
| Tetraethylene glycol dimethacrylate | 5.0 parts |
| 30% phthalocyanine pigment dispersion (MHI 454 produced by Mikuni Sikisosha) | 10.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |

(Evaluation of Light Sensitive Planographic Printing Plate Material Sample 2)

The light sensitive planographic printing plate material sample 2 was evaluated in the same manner as in Example 1. The results are shown in Table 1.

Example 3

(Preparation of Light Sensitive Planographic Printing Plate Material Sample 3)

The following image formation layer coating solution 3 was coated on the support 2 through a wire bar, and dried at 95° C. for 1.5 minutes to give an image formation layer having a dry thickness of 1.2 g/m². Subsequently, the following oxygen-shielding layer coating solution 1 was coated on the resulting image formation layer through a wire bar, and dried at 75° C. for 1.5 minutes to give an oxygen-shielding layer having a dry thickness of 1.5 g/m². Thus, light sensitive planographic printing plate material sample 3 was prepared.

| (Image formation layer coating solution 3) | |
| --- | --- |
| Diazo resin-1 | 5.0 parts |
| Cyclopentadienyl (cumenyl) iron-hexafluorophosphate | 3.0 parts |
| 1,3-Bis(tribromoacetylamino)-2,2-dimethylpropane | 2.0 parts |
| Binder 1 solution | 45.0 parts (in terms of solid content) |
| Polyfunctional oligomer M-8 | 30.0 parts |
| Tetraethylene glycol dimethacrylate | 5.0 parts |
| 30% phthalocyanine pigment dispersion (MHI 454 produced by Mikuni Sikisosha) | 10.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |
| (Oxygen-shielding layer coating solution 1) | |
| Polyvinyl alcohol, Gosenol AL-05 (produced by Nippon Gosei Kagaku Co., Ltd.) | 85.0 parts |
| Polyvinyl Pyrrolidone, Rubitec K-30 (produced by BASF Co., Ltd.) | 15.0 parts |
| Surfinol 465 (produced by Air Products Co., Ltd.) | 0.2 parts |
| Water | 900 parts |

(Evaluation of Light Sensitive Planographic Printing Plate Material Sample 3)

The light sensitive planographic printing plate material sample 3 was imagewise exposed in the same manner as in Example 1. Subsequently, the exposed sample was subjected to development treatment in the same manner as in Example 1, except that a CTP automatic developing machine, Raptor Polymer. (produced by Glunz & Jensen Co., Ltd.) was used in which the exposed sample was pre-washed before developed with the developer, and the oxygen-shielding layer was removed from the developed sample. Thus, a planographic printing plate sample 3 was obtained.

The light sensitive planographic printing plate material sample 3 was evaluated for sensitivity, printing durability and chemical resistance in the same manner as in Example 1, except that the sample was subjected to development treatment, employing a CTP automatic developing machine, Raptor Polymer (produced by Glunz & Jensen Co., Ltd.). The results are shown in Table 1.

Example 4

Comparative light sensitive planographic printing plate material sample 4 was prepared in the same manner as in Example 3, except that allyl methacrylate-methacrylic acid (85:15 by mol) copolymer (molecular weight 30,000) was used instead of binder 1 in the image formation layer. The resulting sample 4 was evaluated in the same manner as in Example 3. The results are shown in Table 1.

TABLE 1

| Examples | Light sensitive planographic printing plate material sample No. | Sensitivity (µJ/cm²) | Printing durability (number) | Chemical resistance (number) | Remarks |
| --- | --- | --- | --- | --- | --- |
| 1 | 1 | 150 | 300,000 | 45 | Inv. |
| 2 | 2 | 180 | 350,000 | 50 | Inv. |
| 3 | 3 | 80 | 400,000 | 45 | Inv. |
| 4 | 4 | 200 | 100,000 | 5 | Comp. |

Inv.: Inventive,
Comp.: Comparative

As is apparent from Table 1, the inventive light sensitive planographic printing plate material samples 1 through 3 provide high sensitivity, printing durability and chemical resistance, as compared with light sensitive planographic printing plate material sample 4.

What is claimed is:

1. A process of preparing a planographic printing plate from a light sensitive planographic printing plate material comprising a hydrophilic support and provided thereon, an image formation layer containing (a) an alkali soluble resin with an acid value of 5 to 200 having an acryloyl group or a methacryloyl group, the alkali soluble resin being obtained by reacting a vinyl copolymer having a monomer unit derived from acrylic acid or methacrylic acid with an epoxy compound having an acryloyl group or a methacryloyl group in the molecule, and (b) a diazo resin, the process comprising the steps of:

imagewise exposing the light sensitive planographic printing plate material to ultraviolet light using an exposure device comprising a digital mirror device (DMD); and removing an image formation layer at non-exposed portions with an aqueous alkali solution to form an image.

2. The process of claim 1, wherein the weight average molecular weight of the alkali soluble resin is in the range of from 5,000 to 200,000.

3. The process of claim 1, wherein the weight average molecular weight of the alkali soluble resin is in the range of from 10,000 to 100,000.

4. The process of claim 1, wherein the image formation layer contains the alkali soluble resin in an amount of from 20 to 90% by weight, and the diazo resin in an amount of from 3 to 20% by weight.

5. The process of claim 1, wherein the diazo resin is a condensation resin obtained by condensation of an aromatic diazonium compound and a carbonyl group-containing compound.

6. The process of claim 5, wherein the diazo resin is a resin represented by the following formula (1) or (2):

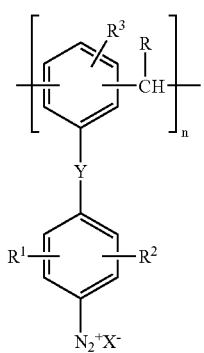

Formula (1)

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; and n represents an integer,

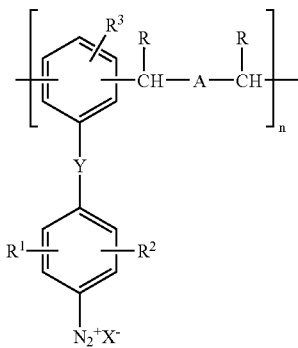

Formula (2)

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; n represents an integer, and A represents a divalent aromatic group.

7. The process of claim 1, wherein the image formation layer further contains an ethylenically unsaturated compound.

8. The process of claim 1, wherein the exposure device comprises, in addition to the DMD, a light source element and an image formation element.

9. The process of claim 1, wherein the image is formed from image data containing a number of pixels and the DMD is comprised of a number of micro-mirrors, which reflect ultraviolet light, the number of the micro-mirrors corresponding to the number of pixels in the image data.

10. The process of claim 1, wherein the ultraviolet light is light having a wavelength of 350 to 450 nm.

11. A process of preparing a planographic printing plate from a light sensitive planographic printing plate material comprising a hydrophilic support and provided thereon, an image formation layer containing (a) an alkali soluble resin with an acid value of 5 to 200 having an acryloyl group or a methacryloyl group, the alkali soluble resin being obtained by reacting a vinyl copolymer having a monomer unit derived from acrylic acid or methacrylic acid with an epoxy compound having an acryloyl group or a methacryloyl group in the molecule, and (b) a diazo resin, the process comprising the steps of:

imagewise exposing the light sensitive planographic printing plate material to ultraviolet light using an exposure device comprising a digital mirror device (DMD); and removing an image formation layer at non-exposed portions with an aqueous alkali solution to form an image, wherein the diazo resin is a resin represented by the following formula (1) or (2):

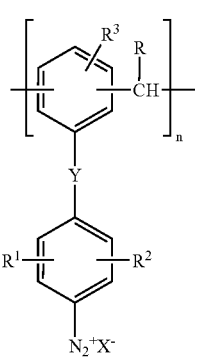

Formula (1)

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; and n represents an integer,

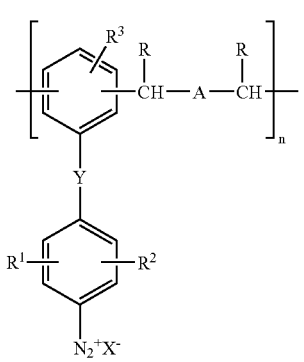

Formula (2)

wherein R represents a hydrogen atom, an alkyl group or a phenyl group; $R^1$, $R^2$ and $R^3$ independently represent a hydrogen atom, an alkyl group or an alkoxy group; $X^-$ represents an anion; Y represents —NH—, —O— or —S—; n represents an integer, and A represents a divalent aromatic group.

* * * * *